(12) United States Patent
Carton et al.

(10) Patent No.: US 11,762,039 B2
(45) Date of Patent: Sep. 19, 2023

(54) ELECTRICAL INSTALLATION COMPRISING A MONITORING MODULE

(71) Applicant: CROUZET AUTOMATISMES, Valence (FR)

(72) Inventors: Hervé Carton, Valence (FR); Thomas Stemmelen, Valence (FR); Loïc Clémenson, Valence (FR)

(73) Assignee: CROUZET AUTOMATISMES, Valence (FR)

( * ) Notice: Subject to any disclaimer, the term of this patent is extended or adjusted under 35 U.S.C. 154(b) by 89 days.

(21) Appl. No.: 17/438,089

(22) PCT Filed: Feb. 21, 2020

(86) PCT No.: PCT/HR2020/050331
§ 371 (c)(1),
(2) Date: Sep. 10, 2021

(87) PCT Pub. No.: WO2020/183083
PCT Pub. Date: Sep. 17, 2020

(65) Prior Publication Data
US 2022/0196758 A1    Jun. 23, 2022

(30) Foreign Application Priority Data
Mar. 11, 2019 (FR) ...................... 1902470

(51) Int. Cl.
*G01R 31/54* (2020.01)
*G01R 31/00* (2006.01)
(52) U.S. Cl.
CPC ........... *G01R 31/54* (2020.01); *G01R 31/008* (2013.01)
(58) Field of Classification Search
CPC ........ G01R 31/54; G01R 31/008; H02H 3/04; H02H 3/10
See application file for complete search history.

(56) References Cited

U.S. PATENT DOCUMENTS

| 4,742,422 A | 5/1988 | Tigges |
| 10,352,990 B2 | 7/2019 | Miyazaki et al. |

(Continued)

FOREIGN PATENT DOCUMENTS

| CN | 102855723 A | 1/2013 |
| CN | 107834866 A | 3/2018 |

(Continued)

OTHER PUBLICATIONS

International Search Report for International Application No. PCT/FR20/050331, dated May 12, 2020, 5 pages.

(Continued)

*Primary Examiner* — Raul J Rios Russo
*Assistant Examiner* — Dilara Sultana
(74) *Attorney, Agent, or Firm* — TraskBritt (57) ABSTRACT

Electrical installation comprising a monitoring module positioned between a sensor connected to a measurement cable and first and second power supply cables for the sensor. The monitoring module comprises a first transistor comprising a first and a second power electrode and a control electrode, the first and the second power electrodes of the first transistor being electrically connected to the second power supply cable and to the measurement cable, respectively, so that, when the first transistor is in the closed state thereof, a first fault value is generated on the measurement cable. The control electrode of the first transistor is connected to the first power supply cable so that the loss of first potential on the first power supply cable, caused by the interruption thereof, automatically triggers the switching of the first transistor to the closed state thereof.

13 Claims, 3 Drawing Sheets

(56) References Cited

U.S. PATENT DOCUMENTS

| | | |
|---|---|---|
| 10,890,601 B2 | 1/2021 | Sanchis |
| 2003/0030954 A1 | 2/2003 | Bax et al. |
| 2005/0018371 A1 | 1/2005 | Mladenik et al. |
| 2013/0106470 A1* | 5/2013 | Takagiwa ........... G01R 31/2607 327/109 |
| 2017/0012530 A1 | 1/2017 | Pasqualetto et al. |
| 2018/0159434 A1 | 6/2018 | Werner et al. |

FOREIGN PATENT DOCUMENTS

| | | | |
|---|---|---|---|
| CN | 110622015 A * | 12/2019 | ................ B60L 1/00 |
| EP | 1865756 A1 | 12/2007 | |
| EP | 3413064 A1 | 12/2018 | |
| JP | 3150794 U | 6/2009 | |
| WO | 2002/061915 A1 | 8/2002 | |

OTHER PUBLICATIONS

International Written Opinion for International Application No. PCT/FR2020/050331, dated May 12, 2020, 11 pages.

\* cited by examiner

ELECTRICAL INSTALLATION COMPRISING A MONITORING MODULE

CROSS-REFERENCE TO RELATED APPLICATIONS

This application is a national phase entry under 35 U.S.C. § 371 of International Patent Application PCT/FR2020/050331, filed Feb. 21, 2020, designating the United States of America and published as International Patent Publication WO 2020/183083 A1 on Sep. 17, 2020, which claims the benefit under Article 8 of the Patent Cooperation Treaty to French Patent Application Serial No. 1902470, filed Mar. 11, 2019.

TECHNICAL FIELD

The disclosure relates to an electrical installation comprising a monitoring module. The disclosure also relates to an aircraft comprising this electrical installation, as well as to a monitoring module for this electrical installation.

BACKGROUND

The applicant knows of such an electrical installation comprising:
a first and a second power supply cable respectively connected to a first and a second different potential of a power supply source;
a measurement cable, the first and second power supply cables and the measurement cable being housed inside one or more cable harnesses;
a sensor capable of measuring a physical quantity, this sensor comprising:
  a first and a second power supply terminal respectively connected to the first and to the second power supply cables;
  an output terminal connected to the measurement cable; and
  a transducer powered by means of the first and second power supply terminals of the sensor, this transducer being capable of converting the measured physical quantity into a corresponding electric signal; and
  the sensor is capable of delivering, on its output terminal, an analog electric signal coding the measurement of the physical quantity using a corresponding value of a potential or of the intensity of a current, the value of the electric signal delivered on the measurement cable systematically being within a predetermined measurement range when the transducer operates correctly;
an electronic computer comprising:
  a first and a second power supply terminal respectively connected to the first and to the second potentials of the power supply source;
  an input terminal connected to the measurement cable;
  an analog-digital converter connected to the input terminal in order to convert the analog electric signal present on the input terminal into a digital signal; and
  a microprocessor programmed to:
    control an item of electrical equipment as a function of the value of the digital signal if this digital value corresponds to a value of the analog electric signal within a predetermined measurement range; and, alternatively
    indicate the interrupted state of the first power supply cable if the value of the digital signal corresponds to a first predetermined fault value located outside any predetermined measurement range;
  a monitoring module positioned between the power supply terminals of the sensor and the first and second power supply cables, this monitoring module being capable of generating, on the measurement cable, the first fault value in response to the interruption of the first power supply cable.

In order to determine whether a cable is interrupted, it is known for inductive sensors to be used that are sensitive to the presence of the current that circulates in this cable in the absence of an interruption. This is disclosed, for example, by application US 2003/0030954. These inductive sensors are sensitive to vibrations. Moreover, it is desirable for the electricity consumption of such monitoring modules to be reduced and for them to be simplified as much as possible in order to reduce cost.

The prior art is also known from US 2005/018371 A1, JP 3150794 U, and EP 3413064 A1.

BRIEF SUMMARY

The aim of embodiments of the disclosure is to address at least one of the aforementioned problems by proposing an electrical installation as claimed in claim 1.

A further aim of embodiments of the disclosure is an aircraft comprising this electrical installation.

Finally, a further aim of embodiments of the disclosure is a monitoring module for completing the aforementioned electrical installation.

BRIEF DESCRIPTION OF THE DRAWINGS

The disclosure will be better understood from reading the following description, which is provided solely by way of a non-limiting example, and with reference to the drawings, in which.

Throughout these figures, the same reference signs are used to denote the same elements. Throughout the remainder of this description, the features and functions that are well known to a person skilled in the art are not described in detail.

DETAILED DESCRIPTION

Chapter I: Embodiments

Figure 1:
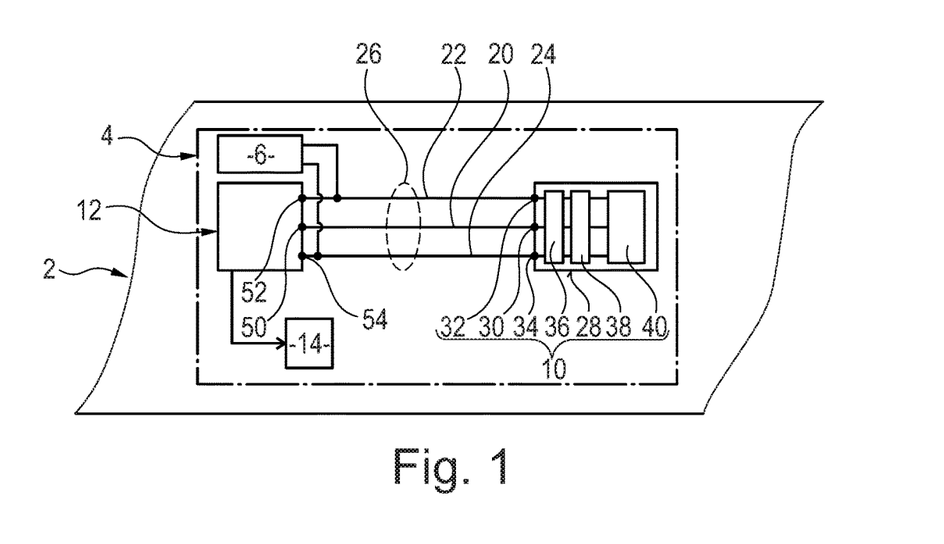
FIG. 1 is a schematic and partial illustration of an aircraft equipped with an electrical installation.

FIG. 1 shows an aircraft 2 such as an airplane. The aircraft 2 is equipped with an electrical installation 4. Only the elements of this electrical installation that are required to understand the disclosure are shown and described hereafter.

The installation 4 typically comprises numerous items of electrical equipment and numerous cable harnesses connecting these different items of electrical equipment together. The installation 4 also comprises a power supply source 6 and the cable harnesses comprise cables that connect each item of electrical equipment requiring power to the source 6.

Hereafter, unless otherwise specified, the term "connect" means electrically connect. The cables that are used to power an item of electrical equipment are called "power supply cables." In the context of an aircraft that is generally electrically isolated from the ground, two power supply cables are required to power an item of electrical equipment. One of these power supply cables has higher potential than the other so that there is a difference in potentials between the power supply terminals of the electrical equipment. The source 6 is a direct voltage source in this case.

In order to simplify FIG. 1, only three items of electrical equipment of the installation 4 have been shown. More specifically, the installation 4 comprises:
- an item of equipment 10 for measuring a physical quantity;
- an electronic computer 12; and
- a controllable item of electrical equipment 14.

The item of equipment 10 measures a physical quantity and converts it into an analog electric signal delivered on a cable 20 dedicated to transmitting this measurement. Hereafter, this cable 20 is called "measurement cable."

In this embodiment, the analog electric signal is an electric potential, the value of which codes the measurement of the physical quantity.

By way of an illustration, the physical quantity is a distance that separates a movable part that can move opposite the item of equipment 10. More specifically, the item of equipment 10 is a proximity sensor that generates a potential VON and, alternatively, a potential VOFF on the cable 20. The potential VON indicates that the movable part has been detected in the proximity of the item of equipment 10. Conversely, the potential VOFF indicates that the movable part has not been detected and therefore that it is not in the proximity of the item of equipment 10.

The item of equipment 10 is also powered by two power supply cables 22 and 24 respectively connected to potentials VH and VL of the source 6. In this case, the potential VH is greater than the potential VL. For example, VH and VL are respectively equal to +28 VDC and 0 VDC.

The cables 20, 22 and 24 are housed, for example, inside the same cable harness 26. In order to simplify FIG. 1, only the cables 20, 22 and 24 of the harness 26 have been shown. However, in reality, such a harness can comprise more than ten, twenty or one hundred cables used to connect other items of electrical equipment to the source 6 and to the computer 12. Still for the sake of simplifying FIG. 1, only the harness 26 has been shown. However, the installation 4 generally comprises more than ten, twenty or one hundred different harnesses.

In this embodiment, the item of equipment 10 comprises a casing 28, inside which the different components of this item of equipment 10 are housed. The casing 28 particularly allows the components of the item of equipment 10 to be protected against dust, humidity and grants it protection against electromagnetic interference. The item of equipment 10 also comprises three terminal blocks 30, 32 and 34 connecting the item of equipment 10 to the ends of the cables 20, 22 and 24, respectively.

Inside the casing 28, the item of equipment 10 successively comprises, starting from the terminal blocks 30, 32 and 34:
- an electrical protection module 36;
- a module 38 for monitoring the cables 22, 24; and
- a sensor 40.

The module 36 protects the electronic components of the item of equipment 10 against overvoltages. In this case, the module 36 therefore especially protects the module 38 and the sensor 40 against such overvoltages.

The module 38 monitors the state of the cables 22 and 24. More specifically, the module 38 is arranged to detect an interruption of one of these power supply cables and, in response, to generate a potential VDS on the cable 20 indicating the interruption of the cable 22 and, alternatively, a potential VDR indicating the interruption of the cable 24. The potentials VDS and VDR are different from each other and are separate from the potentials VON and VOFF delivered by the item of equipment 10 on the cable 20 in the absence of an interruption of the cables of the harness 26. To this end, the module 38 is designed so that the potentials VDS and VDR are both outside a first measurement range [VON−ε; VON+ε] and a second measurement range [VOFF−ε; VOFF+ε]. The number ε is a strictly positive number greater than the fluctuations of the value of the potentials VON and VOFF that can be Observed during normal operation of the item of equipment 10. For example, the number ε is greater than 0.01 (VH−VL) or greater than 0.05(VH−VL). For example, the number ε is greater than 1 volt or 0.5 volts. The potentials VDS and VDR are also less than or equal to the potential VH and greater than or equal to the potential VL.

The interruption of a power supply cable manifests through the interruption of the electrical continuity between the terminal blocks 32, 34 and the corresponding terminal blocks of the source 6. As soon as one of the cables 22, 24 is interrupted, the power supply of the equipment 10 is interrupted and this equipment can no longer operate. In particular, the sensor 40 is no longer powered and can no longer generate a potential on the cable 20. However, even when one of the cables 22 or 24 is interrupted, the module 38 is still capable of generating the potential VDS or the potential VDR on the cable depending on the cable 22 or 24 that has been interrupted.

When powered, the sensor 40 measures the physical quantity and generates the potential VON and, alternatively, the potential VOFF on the cable 20 depending on whether or not the movable part has been detected as being in the proximity.

The computer 12 is designed to process the measurements of the item of equipment 10 and to control, as a function of these measurements, the item of equipment 14. To this end, it comprises an input terminal 50 connected to the cable 20 and, for example, to another end of this cable 20. The computer 12 is also powered by the source 6. To this end, it also comprises two power supply terminals 52 and 54 respectively connected to the potential VH and VL of the source 6. To this end, in this case, the terminals 52 and 54 are respectively connected to the cables 22 and 24.

The item of equipment 14 can be any item of equipment that can be controlled by a computer on the basis of the measurements carried out by the item of equipment 10. For example, the item of equipment 14 can be an electromechanical actuator or a human-machine interface, such as a display device. By way of an illustration, in this case, the item of equipment 14 is a display device capable of displaying the measurements of the item of equipment 10 and, alternatively, of notifying a human being of the interruption of one of the cables 22, 24.

Figure 2:
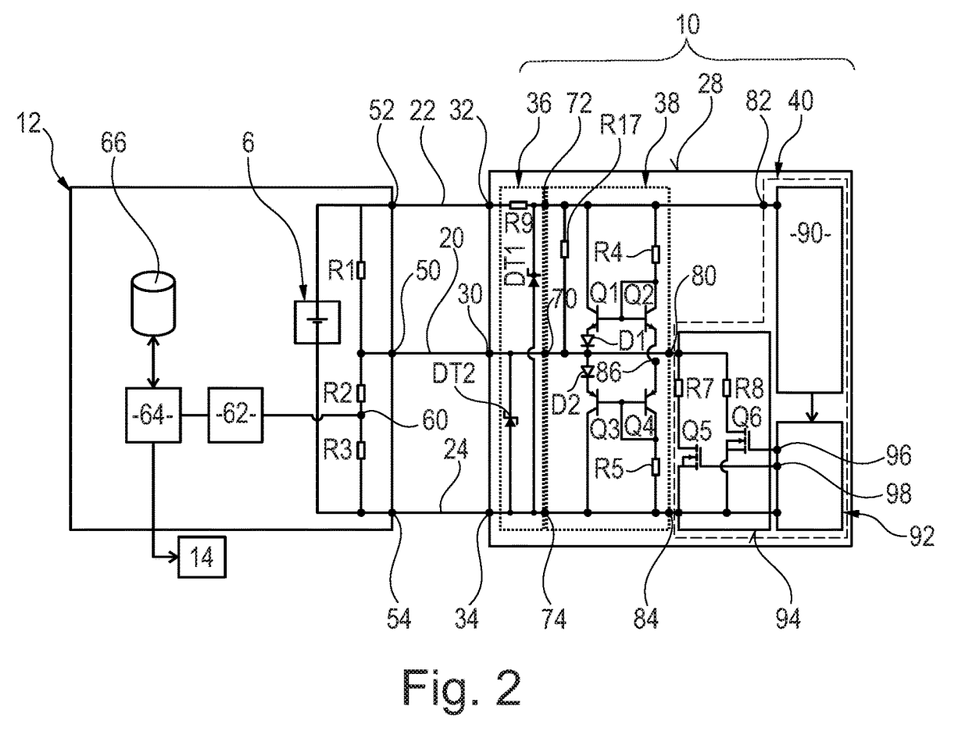
FIG. 2 is an electronic diagram of some of the equipment of the electrical installation of FIG. 1.

FIG. 2 shows the architecture of a first embodiment of the computer 12 and of the item of equipment 10 in more detail. In this first embodiment, the computer 12 integrates the power supply source 6. The source 6 is connected between the terminals 52 and 54 so that the potentials of these terminals 52 and 54 are equal to the potentials VH and VL, respectively. Thus, not only does the computer 12 process the measurements of the item of equipment 10, but it also powers this item of equipment 10. In this case, the ends of the cables 22 and 24 must be connected to the terminals 52 and 54, respectively.

The computer 12 comprises a resistor R1 directly connected between the terminals 50 and 52 and two resistors R2 and R3 directly connected in series between the terminals 50 and 54. "Directly connected" denotes the act of electrically connecting a first electrical component to a second electrical component without passing via one or more active and controllable electronic components such as transistors. Typically, such a direct connection is only implemented using conductive tracks or conducting wires.

A central point 60 is located between the resistors R2 and R3.

Figure 3:
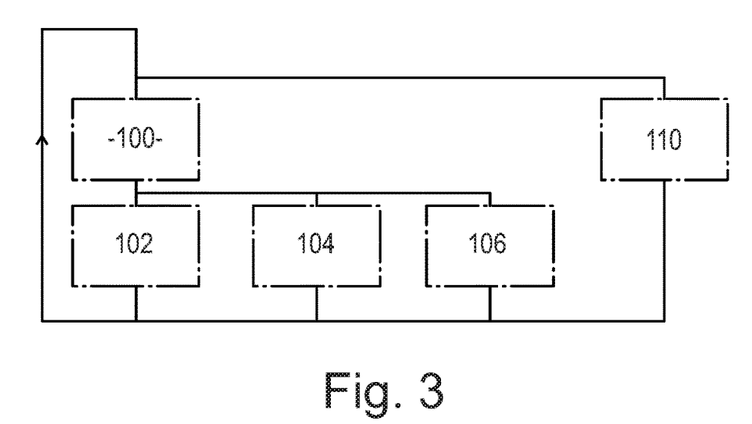
FIG. 3 is a flow chart of an operating method of the electrical installation of FIG. 1.

The computer 12 also comprises:
- an analog-digital converter 62, an input of which is connected to the central point 60;
- a programmable microprocessor 64; and
- a memory 66 comprising instructions and the data required to execute the method of FIG. 3 when they are executed by the microprocessor 64.

The converter 62 converts the analog electric signal present at the point 60 into a corresponding digital value that is delivered to the microprocessor 64. The analog signal present at the point 60 is a function of the potential present at the terminal 50 and therefore of the potential of the cable 20. The potential present on the terminal 50 can be equal:
- to the potentials VON or VOFF in the absence of an interruption of one of the cables 22, 24;
- to the potential VDS in the event of the interruption of the cable 22; and
- to the potential VDR in the event of the interruption of the cable 24.

Due to the resistors R1, R2 and R3, in the event of the interruption of the cable 20 or of the simultaneous interruption of the cables 22 and 24, the potential at the terminal 50 is equal to a potential VDO. The values of the resistors R1, R2 and R3 in this case are selected so that the potential VDO is different from the potentials VDS and VDR and also outside the ranges [VON−ε, VON+ε] and [VOFF−ε; VOFF+ε]. Thus, the computer 12 can also detect an interruption of the cable 20 and/or the simultaneous interruption of the cables 22 and 24. The potential VDO also ranges between the potentials VH and VL.

The converter 62 converts each of the potentials into a corresponding and mutually different digital value. Hereafter, for the sake of simplification of the notations, the same notations VON, VOFF, VDS, VDR and VDO are used to denote the previously described potentials as well as the five corresponding digital values obtained following conversion by the converter 62. In this embodiment, due to the resistor R2, the potential at the central point 60 is smaller than the potential at the terminal 50.

The microprocessor 64 is programmed to execute the method of FIG. 3. To this end, it executes instructions recorded in the memory 66. The memory 66 comprises the fault values VDS, VDR and VDO and the ranges [VON−ε; VON+ε] and [VOFF−ε; VOFF+ε]. Moreover, the memory 66 associates the one or more operation(s) to be executed with each of the fault values if the potential recorded at the point 60 corresponds to one of these fault values. The memory 66 also associates the one or more actions to be executed with each of the ranges [VON−ε; VON+ε] and [VOFF−ε; VOFF+ε] when the value recorded at the point 60 falls within one of these ranges.

The module 36 is connected, on one side, directly to the terminal blocks 30, 32 and 34 and, on an opposite side, directly to central points 70, 72 and 74. The module 36 in this case protects the module 38 and the sensor 40 against the overvoltages. To this end, it comprises:
- a resistor R9 directly connected in series between the terminal block 32 and the point 72;
- a Transil diode DT1, the cathode of which is directly connected between the resistor R9 and the point 72 and the anode of which is directly connected between the terminal block 34 and the point 74;
- a Transil diode DT2, the cathode of which is directly connected between the terminal block 30 and the point 70 and the anode of which is directly connected between the terminal block 34 and the point 74.

The Transil diodes are also known using the acronym TVS ("Transient-Voltage-Suppression").

The module 38 is connected, on one side, directly to the points 70, 72 and 74 and, on the opposite side, directly to an output terminal 80 and to two power supply terminals 82 and 84 of the sensor 40. The terminal 82 is connected to the cable 22 by successively passing via the point 72, the resistor R9 and the terminal block 32. The terminal 84 is connected to the cable 24 by successively passing via the point 74 and the terminal block 34. The terminal 80 is connected to the cable 20 by successively passing via the point 70 and the terminal block 30.

The module 38 comprises two transistors Q1 and Q3. Each transistor comprises two power electrodes and a control electrode. Each transistor is reversibly switchable, in response to a control signal received on the control electrode thereof, between:
- a closed state, in which the two power electrodes thereof are electrically connected together; and
- an open state, in which the two power electrodes thereof are electrically isolated from each other.

Thus, in the closed state, the current can pass through the transistor, whereas in the open state this current does not pass through the transistor. To this end, in the open state, the transistor resists the passage of the current from one to the other of these power electrodes several hundred times more than in the closed state.

In the current case, the transistors Q1 and Q3 are bipolar transistors. Thus, the power electrodes of these transistors are commonly respectively called "collector" and "transmitter," and the control electrode is called "base." More specifically, the transistor Q1 is an NPN transistor and the transistor Q3 is a PNP transistor.

The transmitter of the transistor Q1 is connected to the point 70 by means of a diode D1. The cathode of the diode D1 is directly connected to the point 70. The collector of the transistor Q1 is directly connected to the point 72. The transmitter of the transistor Q3 is connected to the point 70 by means of a diode D2. The anode of the diode D2 is directly connected to the point 70. The collector of the transistor Q3 is directly connected to the point 74.

The module 38 also comprises a bridge directly connected between the terminals 82 and 84. This bridge successively comprises, connected in series, starting from the terminal 82 and extending towards the terminal 84:
- a resistor R4;
- a transistor Q2;
- a central point 86;
- a transistor Q4; and
- a resistor R5.

This bridge is electrically isolated from the output terminal 80 and from the terminal block 30.

Preferably, the resistors R4 and R5 are selected so that the following relationship is verified: (V70−VD2)/(VH−VL) <V86/(VH−VL)<(V70+VD1)/VH−VL), where:
- V70 and V86 are the potentials at points 70 and 86, respectively; and
- VD1 and VD2 are the voltage drops between the cathode and the anode, respectively, of the diodes D1 and D2.

In order to verify the aforementioned relationship, in practice, the sum of the values of the resistors R4 and R5 is close to the sum of the values of the resistors R2 and R3. Furthermore, preferably, the values of the resistors R4 and R5 are selected so that the ratio R5/(R4+R5) is close to one. By way of an example, when the sum of the values of the resistors R2 and R3 is equal to 60,000 Ohms and when the value of the resistor R1 is equal to 3,500 Ohms, the values of the resistors R4 and R5 are equal to 2,000 Ohms and 60,000 Ohms, respectively.

The transistors Q2 and Q4 are identical to the transistors Q1 and Q3, respectively. The collector of the transistor Q2 is directly connected to the resistor R4 and its transmitter is directly connected to the point 86. The collector of the transistor Q4 is directly connected to the resistor R5 and its transmitter is directly connected to the point 86. The base of the transistor Q1 is directly connected, on the one hand, to the base of the transistor Q2 and, on the other hand, between the collector of the transistor Q2 and the resistor R4. The base of the transistor Q3 is directly connected, on the one hand, to the base of the transistor Q4 and, on the other hand, between the collector of the transistor Q4 and the resistor R5.

Therefore, the module 38 comprises four transistors at most.

The module 38 also comprises a resistor R17 directly connected between the terminals (central points 70 and 72). This resistor R17 is a pull-up resistor for preventing the potential of the cable 20 from floating in the event of a fault, in particular, in an interface 94 of the sensor 40. The interface 94 is described hereafter.

The sensor 40 is powered by the voltage present between the terminals 82 and 84. The analog electric signal corresponding to the measured physical quantity is delivered on the terminal 80. The sensor 40 particularly comprises:
- a transducer 90;
- a comparator 92; and
- the interface 94.

The transducer 90 converts the measured physical quantity into a measured electric signal transmitted to the comparator 92. The comparator 92 compares the value of the measured electric signal to a predetermined threshold. If the value of the measured electric signal is above this threshold, i.e., the proximity of the movable part is detected, the comparator 92 generates a control signal only on an output port 96. Conversely, if the value of the measured electric signal is below this threshold, i.e., the proximity of the movable part is not detected, the comparator 92 generates a control signal only on a port 98.

The interface 94 comprises a first and a second branch connected in parallel between the terminals 80 and 84. The first branch successively comprises, connected in series, starting from the terminal 80 and extending towards the terminal 84, a resistor R7 and a transistor Q5. The transistor Q5 is an N-type enhancement isolated gate field effect transistor. Isolated gate field effect transistors are better known using the acronym MOSFET ("Metal-Oxide Semiconductor Field-Effect Transistor"). In the case of MOSFET transistors, the power electrodes correspond to the source and to the drain and the control electrode corresponds to the gate.

The drain and the source of the transistor Q5 are directly connected to the resistor R7 and to the terminal 84, respectively. The gate of the transistor Q5 is directly connected to the port 98.

The second branch is identical to the first branch, except that the resistor R7 is replaced by a resistor R8 and that the gate of the transistor Q6 is directly connected to the port 96. The transistor Q6 is identical to the transistor Q5.

The resistor R8 is different from the resistor R7. The values of the resistors R7 and R8 respectively determine the values of the potentials VOFF and VON. For example, the values of the resistors R7 and R8 are equal to 6,990 Ohms and 11,150 Ohms, respectively.

With the previously provided digital values for the resistors, and in the case whereby the potentials VH and VL are equal to +28 Vdc and 0 Vdc, respectively, the potentials VON, VOFF, VDS, VDR and VDO are, for example, equal to 20.37 Vdc, 18.33 Vdc, 3.03 Vdc, 26.74 Vdc and 26.02 Vdc.

The operation of the electrical installation 4 will now be described with reference to the method of FIG. 3. Hereafter, V50, V70 and V86 denote the electric potentials at the terminal 50 and the points 70 and 86, respectively.

During a normal operating phase 100, none of the cables 20, 22 and 24 is interrupted. Under these conditions, the potentials V50 and V86 are close. Under these conditions, the transistors Q1 and Q3 are in their open state. The potential of the cable 20 is then fixed by the interface 94. More specifically, if the movable part is detected in the proximity of the transducer 90, the transistor Q6 is in the closed state thereof and the transistor Q5 is in the open state thereof. The potential of the cable 20 is then equal to the potential VON. Conversely, if the movable part is not detected as being in the proximity of the transducer 90, the transistor Q6 is then in the open state thereof and the transistor Q5 is in the closed state thereof. The potential of the cable 20 is then imposed by the resistor R7 and corresponds to the potential VOFF.

During a first failure phase 102, only the cable 22 is interrupted. The sensor 40 is then no longer powered and the transistors Q5 and Q6 are therefore simultaneously in their open state. The potential V86 then drops below the potential V50. The transistor Q3 therefore switches to the closed state thereof, whereas the transistor Q1 remains in the open state thereof. Under these conditions, the potential of the cable 20 is equal to the potential VDS.

During a second failure phase 104, only the cable 24 is interrupted. In a similar manner to that described during the phase 102, the sensor 40 is no longer powered and the transistors Q5 and Q6 are simultaneously in their open state. The potential V86 then becomes greater than the potential V50, which causes the transistor Q1 to switch to the closed state thereof, whereas the transistor Q3 remains in the open state thereof. Under these conditions, the potential of the cable 20 is equal to the potential VDR.

During a third failure phase 106, only the cable 20 is interrupted or the cables 22 and 24 are simultaneously interrupted. In this case, the potential V50 at the terminal 50 becomes equal to the potential VDO.

At the same time as these different phases, during a phase 110, the computer 12 continuously converts the potential at the point 60 into a digital value processed by the microprocessor 64. The microprocessor 64 then controls one or more items of electrical equipment as a function of this digital value. For example, if the potential at the terminal 50 is one of the potentials VDS, VDR, VDO, it commands the item of equipment 14 to display an error message indicating that a cable is interrupted. Typically, this error message also identifies the interrupted cable from among the cables 20, 22 and 24.

If the potential on the terminal 50 is equal to the potential VON or VOFF, it commands the item of equipment 14 to display a message that indicates the detection of the movable part in the proximity of the sensor 40 and, alternatively, the absence of this detection.

Figure 4:
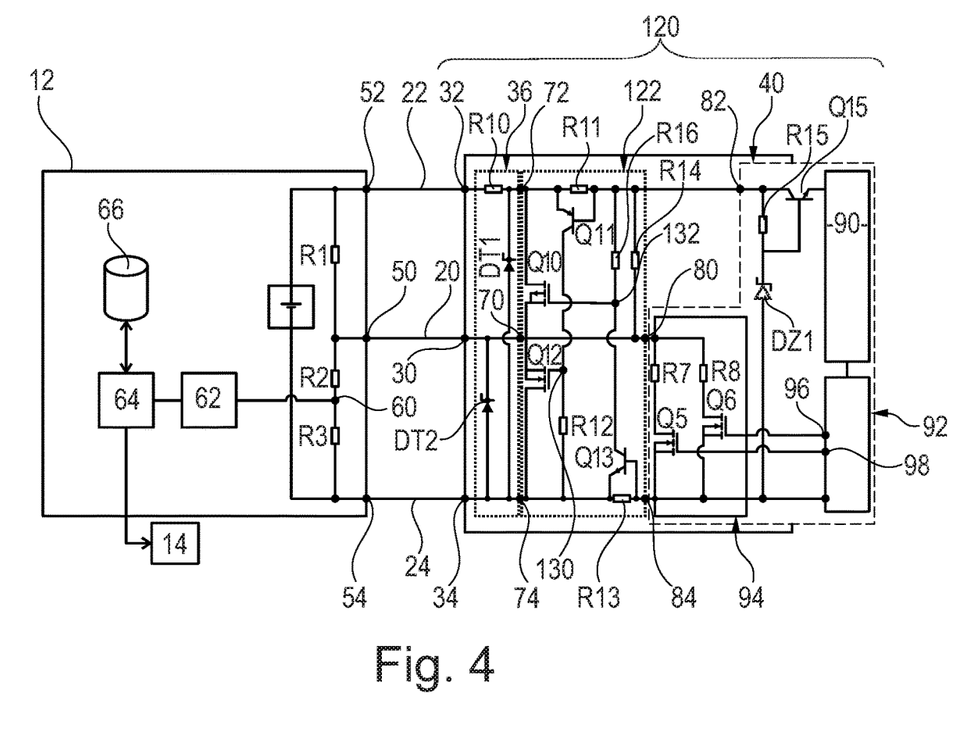
FIG. 4 is an electronic diagram of another embodiment of the electrical installation.

FIG. 4 shows an item of equipment 120 that is capable of being used instead of the item of equipment 10. The item of equipment 120 in this case is identical to the item of equipment 10, except that the monitoring module 38 is replaced by a monitoring module 122.

The module 122 fulfils the same functions as the module 38, i.e., it generates the potential VDS on the cable 20 when the cable 22 is interrupted and, alternatively, it generates the potential VDR when the cable 24 is interrupted. However, in this embodiment, instead of using the loss of potential on the interrupted cable to control the transistors, it is the loss of current in the interrupted cable that is used to control these transistors.

More specifically, as in the module 38, the module 122 comprises two transistors Q10 and Q12 connected to the cables 20, 22 and 24, as previously described for the transistors Q1 and Q3. In this case, the transistors Q10 and Q12 are a P-type enhancement MOSFET transistor and an N-type enhancement MOSFET transistor, respectively. The sources of the transistors Q10 and Q12 are directly connected to the point 70.

The module 122 also comprises a resistor R11 connected in series between the point 72 and the terminal 82 and a resistor R13 connected in series between the point 74 and the terminal 84. The module 122 comprises two transistors Q11 and Q13 connected to the terminals of the resistors R11 and R13, respectively. In this case, the transistors Q11 and Q13 are bipolar transistors, respectively, PNP and NPN transistors. The transmitter of the transistor Q11 is directly connected to the point 72. The base of the transistor Q11 is directly connected between the resistor R11 and the terminal 82. The collector of the transistor Q11 is directly connected to the gate of the transistor Q12. The gate of the transistor Q12 is also connected between the point 74 and the resistor R13 by passing via a resistor R12.

The transmitter of the transistor Q13 is directly connected between the point 74 and the resistor R13. The base of the transistor Q13 is directly connected between the resistor R13 and the terminal 84. The collector of the transistor Q13 is directly connected to the gate of the transistor Q10. The gate of the transistor Q10 is connected between the resistor R11 and the terminal 82 by passing via a resistor R16.

A resistor R14 is also directly connected between the terminals 80 and 82. The resistor R14 in this case fulfils the same function as the resistor R17 of the module 38.

In FIG. 4, the electronic diagram of the sensor 40 has been specified to show some of the components thereof that allow the operation of the item of equipment 120 to be better understood. The sensor 40 successively comprises, connected in series between the terminals 82 and 84, a resistor R15 and a Zener diode DZ1. The cathode of the diode DZ1 is directly connected to the resistor R15. The sensor 40 also comprises, connected in series with the cable 22, a transistor Q15, for which the collector is directly connected to the terminal 82 and the transmitter is connected to the transducer 90. The base of the transistor Q15 is directly connected between the resistor R15 and the cathode of the diode DZ1.

The operation of the item of equipment 120 is identical to that of the item of equipment 10, except that in this case the interruption of the cable 22 or of the cable 24 is detected on the basis of the current that circulates in these cables. For these explanations of the operation of the module 122, V130 and V132 respectively denote the electric potentials at a point 130 directly connected to the gate of the transistor Q12 and at a point 132 directly connected to the gate of the transistor Q10.

In the absence of an interruption of the cables 22 and 24, the resistors R11 and 113 are passed through by currents with a non-zero intensity, which causes a voltage drop at the terminals of these resistors. This voltage drop keeps the transistors Q11 and Q13 in the closed state thereof. The difference V50–V130 between the potentials V50 and V130 is then less than a threshold Vg12, beyond which the transistor Q12 switches to the closed state thereof. Similarly, the difference V132–V50 between the potentials V132 and V50 is also less than a threshold Vg10, beyond which the transistor Q10 switches to the closed state thereof. Thus, in the absence of an interruption of the cables 22 and 24, the transistors Q10 and Q12 are in their open state.

When only the cable 22 is interrupted, the intensity of the current in this cable 22 becomes zero. The voltage drop at the terminals of the resistor R11 is then also zero, which causes the transistor Q11 to switch to the open state thereof. The potential V130 then decreases and the difference V50–V130 becomes greater than the threshold Vg12. The transistor Q12 therefore switches to the closed state thereof. At the same time, the current that passes through the resistor R13 is not cancelled out. Indeed, even when the cable 22 is interrupted, there is a difference in potentials between the terminals 80 and 84. This difference in potentials is caused by the resistors R1, R2 and R3 of the computer 12. A non-zero current therefore exists that passes through the resistor R14, the resistor R15, the diode DZ1 and the resistor R13. This non-zero current is sufficient to keep the transistor Q13 in the closed state thereof and therefore to keep the transistor Q10 in the open state thereof. Under these conditions, the module 122 generates the potential VDS on the cable 20. Thus, the computer 12 can detect and indicate the interruption of the cable 22.

When only the cable 24 is interrupted, the intensity of the current in this cable 24 is zero. The voltage drop at the terminals of the resistor R13 is then also zero, which causes the transistor Q13 to switch to the open state thereof. The potential V132 then increases and the difference V132–V50 becomes greater than the threshold Vg10. Therefore, the transistor Q10 switches to the closed state thereof. At the same time, the current that passes through the resistor R11 is not cancelled out, which keeps the transistor Q12 in the open state thereof. In this case, the non-zero current that passes through the resistor R11 originates from the fact that, even if the cable 24 is interrupted, there is a difference in potentials between the terminals 80 and 82. Therefore, a non-zero current exists that successively passes through the resistor R14 and the resistor R11. This current is sufficient to keep the transistor Q11 in the closed state thereof and therefore to keep the transistor Q12 in the open state thereof. Thus, in the event of the interruption of the cable 24, the module 122 generates the potential VDR on the cable 20. For this reason, the computer can detect and indicate the interruption of the cable 24.

The rest of the operation of the module 122 is identical to that which has been described with reference to the method of FIG. 3.

Figure 5:
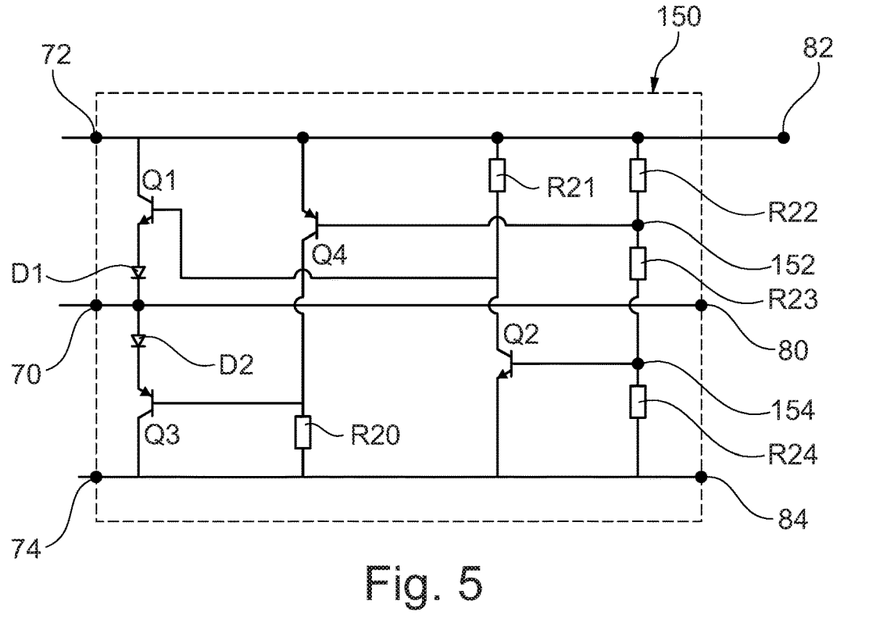
FIGS. 5 and 6 are alternative electronic diagrams of a monitoring module that can be used in the electrical installation and that is based on the diagram of FIG. 2.

FIG. 5 shows a monitoring module 150 capable of detecting an interruption of the cable 22 and, alternatively, of the cable 24 on the basis of the voltage drop that this causes in the interrupted cable. The module 150 is capable of being used instead of the module 38 of FIG. 2. The module 150 is identical to the module 38, except that the control electrodes of the transistors Q1 and Q3 are not connected in the same way to the cables 24 and 22, respectively. In this embodiment, the transmitter of the transistor Q2 is directly connected to the terminal 84. The collector of the transistor Q2 is connected to the terminal 82 by means of a resistor R21. The base of the transistor Q1 is directly connected between this resistor R21 and the transistor Q2. The transmitter of the transistor Q4 is directly connected to the terminal 82. The collector of the transistor Q4 is connected to the terminal 84 by means of a resistor R20. The base of the transistor Q3 is directly connected between this resistor R20 and the transistor Q4.

The module 150 also comprises a bridge of three resistors R22, R23 and R24 connected in series between the terminals 82 and 84. More specifically, the resistor R22 is directly connected between the terminal 82 and a central point 152. The resistor R23 is directly connected between the point 152 and a central point 154. The resistor R24 is directly connected between the point 154 and the terminal 84. The bases of the transistors Q2 and Q4 are directly connected to the central points 154 and 152, respectively. The values of the resistors R23, R24 and R25 are selected so that:

in the absence of an interruption of the cables 22 and 24, the transistors Q2 and Q4 are in their closed states;
in response to an interruption of the cable 22, only the transistor Q4 switches to the open state thereof; and
in response to an interruption of the cable 24, only the transistor Q2 switches to the open state thereof.

The module 150 operates as follows. When the cable 22 is interrupted, the potential at the points 152 and 154 drops, which causes the transistors Q4 and Q2 to open. Opening the transistor Q4 in turn causes the transistor Q3 to close, since the potential at the point 70 is greater than the potential at the point 74. In the event of an interruption of the cable 24, no more current can circulate in the bridge of resistors R22-R23-R24. The transistors Q4 and Q2 are blocked, i.e., in their open states. Under these conditions, only the transistor Q1 is on, since the potential at the point 72 is greater than the potential at the point 70.

Figure 6:
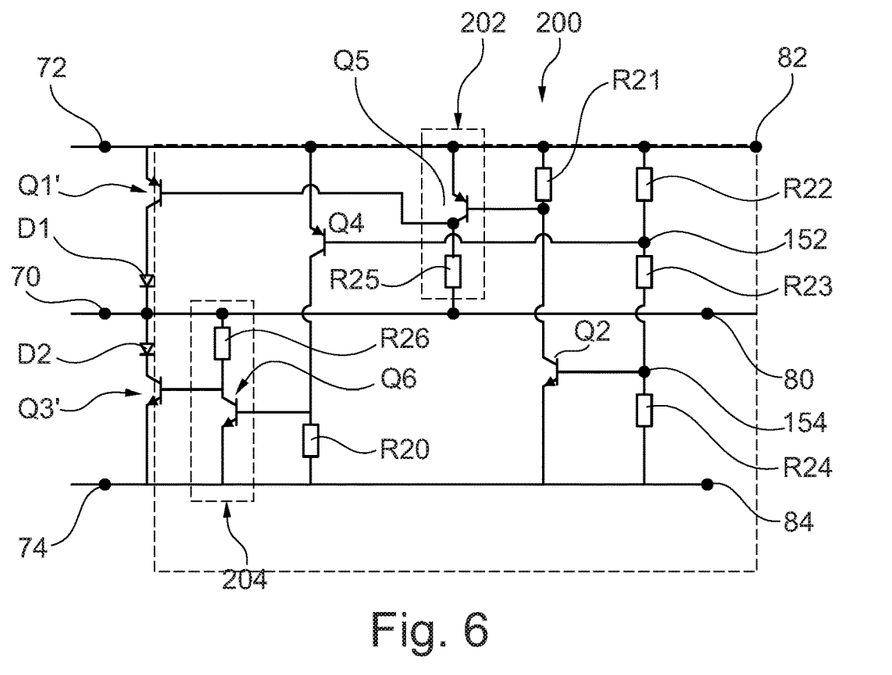

FIG. 6 shows a monitoring module 200 capable of detecting an interruption of the cable 22 and, alternatively, of the cable 24 on the basis of the voltage drop that this causes in the interrupted cable. The module 200 is capable of being used instead of the module 38 of FIG. 2. The module 200 is identical to the module 150, except that:

the transistors Q1 and Q3 are each replaced by bipolar transistors Q1' and Q3', respectively; and
inverter stages 202 and 204 are introduced between the bases of the transistors Q1' and Q3' and the transistors Q2 and Q4, respectively.

The transistors Q1' and Q3' are identical to the transistors Q1 and Q3, respectively, except that their polarities are reversed. Thus, in the module 200, it is the collectors of the transistors Q1' and Q3' that are respectively directly connected to the anode of the diode D1 and to the cathode of the diode D2.

The inverter stage 202 comprises, connected in series between the terminals 82 and 80, a bipolar transistor Q5 and a resistor R25. The transmitter of the transistor Q5 is directly connected to the terminal 82 and the collector thereof is connected to the terminal 80 by passing via the resistor R25. The base of the transistor Q5 is directly connected between the resistor R21 and the collector of the transistor Q2.

The inverter stage 204 comprises, connected in series between the terminals 80 and 84, a bipolar transistor Q6 and a resistor R26. The transmitter of the transistor Q6 is directly connected to the terminal 84 and the collector thereof is connected to the terminal 80 by passing via the resistor R26. The base of the transistor Q6 is directly connected between the resistor R20 and the collector of the transistor Q4.

The operation of the module 200 is similar to that of the module 150, except that the control signals of the transistors Q1' and Q3' are reversed. More specifically, the interruption of the cable 22 causes the transistor Q4 to open, as previously explained for the module 150. The opening of the transistor Q4 causes the transistor Q6 to open, which in turn causes the transistor Q3' to close. Similarly, the interruption of the cable 24 causes the transistors Q2 and Q5 to open and the transistor Q1' to close. This embodiment is interesting in that it allows the transistors Q1' and Q3' to be saturated more significantly in response to an interruption of the cables 24 and 22, respectively.

Chapter II: Variants

Variants of the Monitoring Module:

In a simplified variant, only the state of one of the two power supply cables 22 or 24 is monitored. In this case, the architecture of the monitoring module can be simplified.

For example, only the state of the cable 22 is monitored. The module 38 is then simplified by removing the transistor Q1 and by replacing it with a systematically open electrical circuit. The transistor Q2 is replaced by a systematically closed electrical circuit, such as a conductive track. The module 122 is then simplified by removing the transistors Q10 and Q13 and by replacing them with systematically open electrical circuits. The resistor R13 is also omitted and replaced by a wire connection. Still with reference to this case, the module 150 can be simplified by replacing the transistor Q1 with a systematically open electrical circuit and by removing the resistor R21, the transistor Q2 and the resistor R24. Similarly, the components of the module 200 only used to monitor the state of the cable 24 can be omitted. When only the state of the cable 22 is monitored, the computer 12 is not programmed to monitor and indicate the interrupted state of the cable 24.

Similarly, the architecture of the modules 38, 122, 150 and 200 can be simplified if only the state of the cable 24 is monitored.

The monitoring module can be located in a casing independent of the casing 28 containing the sensor 40. In this case, preferably, the monitoring module is connected to the cable 22, 24 at a site that is as close as possible to the casing 28 containing the sensor 40.

Other embodiments of the monitoring module 38 are possible. For example, the transistors Q2 and Q4 are replaced by first and second diodes, respectively. The cathode of the first diode and the anode of the second diode are then directly connected to the point 86. The transistors Q2 and Q4 can also be replaced by a simple wire connection. In this latter case, the values of the resistors R4 and R5 must be adapted. In particular, in order to select values of the resistors R4 and R5, then the voltages of the base-transmitter junctions of the transistors Q1 and Q3 must be taken into account.

Other embodiments of the module 150 or 200 are also possible. For example, the bridge comprising the resistors R21, R22 and R24 is replaced by a first and a second parallel bridge each comprising two resistors. The bases of the transistors Q4 and Q2 are then connected between the two resistors of the first and of the second bridges, respectively.

In a simplified variant, the diodes D1 and D2 are omitted. In this case, after an interruption of one of the cables 22, 24, the potentials VDS and VDR appear, then disappear after a certain time period. In this case, the potentials VDS and VDR are called "transient" potentials. The computer 12 is adapted to detect a fault on the basis of such transient potentials.

The bipolar transistors can be replaced by other types of transistors such as, for example, MOSFET transistors. Reciprocally, the MOSFET transistors can be replaced by other types of transistors such as, for example, bipolar transistors. When the MOSFET transistors of the module 122 are replaced by bipolar transistors, preferably, the diodes D1 and D2 are added to the module 122 in a similar manner to that described for the module 38.

As a variant, the transistor Q11 is replaced by an NPN bipolar transistor, the base of which is directly connected between the resistors R10 and R11 and the collector of which is connected between the resistor R11 and the terminal 82. A similar modification can be applied to the transistor Q13.

The modules 38, 122, 150 and 200 can be adapted to code the faults of the cables 22, 24 not with specific potentials VDS and VDR, but with specific intensities IDS and IDR of a current generated on the cable 20. In this case, the computer 12 is adapted to also record the intensity of the current on the cable 20. The intensity of these currents coding the faults is regulated, for example, by connecting resistors in series with the transistors Q1, Q3, Q10 and Q12.

Inverter stages, such as the stages 202 and 204, also can be implemented in the module 122 in a similar manner to that described with reference to FIG. 6.

In all the embodiments, additional resistors can be added, in particular, in series with the transistors, for example, to limit or cancel out the consequences of possible temperature variations on the operation of the monitoring module.

Variants of the Sensor:

The number of possible predetermined measurement ranges for the sensor can be greater than two. This is the case, for example, if the sensor 40 detects three different states of the measured physical quantity and matches each of these three states with three different potentials V1, V2 and V3.

In another embodiment, the physical quantity measured and delivered by the sensor continuously varies over a range of potentials [LMIN; LMAX], where LMIN and LMAX are different limits spaced apart from each other by at least 1 volt or 0.5 volts. In this case, the range [LMIN; LMAX] ranges between the potentials VDR and VDO or between the potentials VDO and VDS, so that this range does not span over one of the potentials VDS, VDO and VDR. In the case of a continuous measurement of the physical quantity, generally, only one range of measurements exists.

The preceding description applies to any type of sensor powered by means of two power supply cables and that transmits the measurements thereof by means of a measurement cable independent of the two power supply cables. In particular, the nature of the physical quantity is not important. For example, the physical quantity can be a magnetic field, the intensity of a current, a voltage, a temperature, the intensity of light radiation or other. The information measured on the physical quantity can be only binary information, as in the case of the sensor 40, or information that continuously varies over a range of measurements as a function of the variations of the measured physical quantity.

Other Variants:

As a variant, the power supply source is independent of the computer 12 and is located outside the computer 12.

In another simplified variant, the computer is not programmed to monitor and indicate the interrupted state of the cable 20.

The computer 12 is not necessarily produced using a programmable microprocessor. For example, it also can be produced in the form of a hard electronic circuit, i.e., not reprogrammable, such as, for example, on the basis of operational amplifiers arranged to compare the potential at the terminal 50 with the potential VON, VOFF, VDS, VDR and VDO.

Other embodiments of the protection module 36 are possible. For example, as a variant, the module 36 is arranged to protect, in addition to or instead of, the module 38 and the sensor 40 against surges. It is also possible for these same functions to be produced with electronic components other than Transit diodes.

The description provided herein can be implemented in vehicles other than an aircraft. For example, the electrical installation can be implemented in a motor vehicle, a rail vehicle or even a semi-mobile or fixed installation. The electrical installation also can be implemented in aircraft other than an airplane such as, for example, a helicopter.

The different cables monitored by the monitoring module do not all need to be housed in the same harness. In particular, in a particular embodiment, the different monitored cables are housed in different harnesses.

In order for that which has been described herein to operate, the terminals 52 and 54 do not need to be directly connected to the cables 22 and 24. The terminals 52 and 54 simply need to be connected to the potentials VH and VL, respectively. To this end, cables different from the cables 22 and 24 can be used.

Chapter III: Advantages of the Described Embodiments

Advantages Common to the Different Embodiments:

Using a transistor for which the control electrode is connected to the cable to be monitored allows the state of this transistor to be simply switched in response to an interruption of this cable, without requiring the use of a more complex current or voltage sensor, such as a magnetic field sensor, to this end. Moreover, since the monitoring module only uses transistors and resistors, and therefore does not use a more complex sensor, it is more vibration resistant.

The fact that the power electrodes of this transistor are connected between the measurement cable and the other power supply cable simply allows the information to be coded on the state of the cable to be monitored, irrespective of the interrupted or non-interrupted state of the monitored power supply cable. Moreover, this allows an electric signal to be used to code the presence of a fault on the cable 20, which leaves a wide range of possibilities for coding the measurements of the sensor, without these values overlapping with one of the values used to code a fault.

Positioning the monitoring module between the terminals of the sensor and the terminals of the computer allows an interruption of a power supply cable to be detected independently of the operating state of the sensor.

The monitoring modules described herein comprise very few electronic components. They are therefore equally easy to produce, consume very little energy and are inexpensive.

The use of both transistors Q1 and Q3 or Q10 and Q12 in the monitoring module allows both an interruption of the cable 22 and an interruption of the cable 24 to be detected, whilst remaining capable of distinguishing between these two faults.

Setting the potentials VDS and VDR so that they differ from the potential VDO also allows the interruption of the measurement cable and/or the simultaneous interruption of the cables 22 and 24 to be detected.

The use of an inverter stage, such as the stage 202 or 204 of the module 200, allows the transistors used to generate the potentials VDS and VDR to be further saturated.

Advantages Specific to the Modules 38, 150, 200:

When the closure of the transistor Q1 or Q3 is triggered by the loss of potential on the monitored power supply cable, this allows the interruption of one of these power supply cables to be indicated independently of the current that circulates on this power supply cable. Thus, this embodiment is reliable with respect to disruptions in the current that could be caused by a failure of the sensor 40.

The module 150 is advantageous compared to the module 38 in that it allows greater flexibility with respect to the selection of the values of the resistors R7 and R8 and therefore with respect to the selection of the values of the potentials VON and VOFF. Indeed, in the module 38, when the transistor Q5 is in the closed state, the resistor R7 is connected parallel to the resistors R2 and R3, which modifies the value of the resistance between the terminals 50 and 54 of the computer 12. However, the value of the resistor R5 must remain close to the value of the resistance between the terminals 50 and 54. This proximity constraint limits the possible choices for the value of the resistance R7. Similarly, the possible choices for the value of the resistance R8 are also limited. The module 150 alleviates these limitations with respect to the choice of the values of the resistors R7 and R8. Indeed, the values of the resistors R22, R23 and R24 are not imposed by the values of the resistors R1, R2 and R3. In particular, with the module 150 the difference between the potentials VDO and VDR can be increased.

In the module 38, connecting the control electrode of the transistors Q1 and Q3 to the point 86 allows these transistors to be switched as a function of the potentials present on the cables 22 and 24 and independently of the current that can circulate on these same cables.

In the module 38, the use of the transistors Q2 and Q4 allows the voltage drop between the control electrode and the power electrode of the transistors Q1 and Q3 to be compensated. This makes the operation of the module 38 more reliable.

The use of the diodes D1 and D2 prevents the potentials VDS and VDR from being transient potentials. When such a diode D1 or D2 is used in combination with a MOSFET transistor, it prevents current from returning from the source to the drain of the MOSFET transistor, due to the intrinsic diode of a MOSFET, in response to an interruption of the cable 22 or 24.

Advantages of the Module 122:

When the closure of the transistor Q10 or Q12 is triggered by a variation in the intensity of the current that circulates in the monitored power supply cable, this allows the interruption of this monitored power supply cable to be indicated independently of the potential present on this cable. Thus, this embodiment is reliable with respect to any disruptions of the potential of the power supply cable caused by a failure of the sensor, for example.

The use of only one transistor Q11 or Q13 and of only one resistor R11 and R13 to generate the control signal of the transistor Q10 or Q12 limits the number of components and simplifies the monitoring module 122.

The invention claimed is:

1. An electrical installation comprising:
   a first and a second power supply cable respectively connected to a first and a second different potential of a power supply source;
   a measurement cable, the first and second power supply cables and the measurement cable being housed inside one or more cable harnesses;
   a sensor capable of measuring a physical quantity, this sensor comprising:
      a first and a second power supply terminal respectively connected to the first and to the second power supply cables;
      an output terminal connected to the measurement cable; and
      a transducer powered by means of the first and second power supply terminals of the sensor, this transducer being capable of converting the measured physical quantity into a corresponding electric signal; and
      the sensor is capable of delivering, on its output terminal, an analog electric signal coding the measurement of the physical quantity using a corresponding value of a potential or of the intensity of a current, the value of the electric signal delivered on the measurement cable systematically being within a predetermined measurement range when the transducer operates correctly;
   an electronic computer comprising:
      a first and a second power supply terminal respectively connected to the first and to the second potentials of the power supply source;
      an input terminal connected to the measurement cable;
      an analog-digital converter connected to the input terminal in order to convert the analog electric signal present on the input terminal into a digital signal; and
      a microprocessor programmed to:
         control an item of electrical equipment as a function of the value of the digital signal if this digital value corresponds to a value of the analog electric signal within a predetermined measurement range; and, alternatively
         indicate the interrupted state of the first power supply cable if the value of the digital signal corresponds to a first predetermined fault value located outside any predetermined measurement range;
   a monitoring module positioned between the power supply terminals of the sensor and the first and second power supply cables, this monitoring module being capable of generating, on the measurement cable, the first fault value in response to the interruption of the first power supply cable;
wherein the monitoring module comprises a first transistor comprising a first and a second power electrode and a control electrode, this first transistor being capable of switching, as a function of the control signal received on the control electrode thereof, between:
   an open state, in which the power electrodes thereof are electrically isolated from each other; and
   a closed state, in which the power electrodes thereof are electrically connected together;

the first and the second power electrodes of the first transistor being electrically connected to the second power supply cable and to the measurement cable, respectively, so that, when the first transistor is in the closed state thereof, the first fault value is generated on the measurement cable, and the control electrode of the first transistor being connected to the first power supply cable, so that the loss of first potential on the first power supply cable, caused by the interruption thereof, automatically triggers the switching of the first transistor to the closed state thereof and so that, alternatively, the absence of interruption of the first power supply cable keeps the first transistor in the open state thereof.

2. The installation as claimed in claim 1, wherein:
the microprocessor is also programmed to indicate the interrupted state of the second power supply cable if the value of the digital signal corresponds to a second predetermined fault value, said second fault value being different from the first fault value and being outside any predetermined measurement range; and
the monitoring module comprises a second transistor comprising a first and a second power electrode and a control electrode, this second transistor being capable of switching, as a function of the control signal received on the control electrode thereof, between:
an open state, in which the power electrodes thereof are electrically isolated from each other; and
a closed state, in which the power electrodes thereof are electrically connected together;
the first and the second power electrodes being electrically connected to the first power supply cable and to the measurement cable, respectively, so that, when the second transistor is in the closed state thereof, the second predetermined fault value is generated on the measurement cable, the control electrode of the second transistor is connected to the second power supply cable, so that the loss of second potential on the second power supply cable, caused by the interruption thereof, automatically triggers the switching of the second transistor to the closed state thereof and so that, alternatively, the absence of interruption of the second power supply cable keeps the second transistor in the open state thereof.

3. The installation as claimed in claim 1, wherein the monitoring module comprises:
a first branch connected between the first and second power supply terminals of the sensor, this first branch comprising a third transistor, the power electrodes of which are connected in series with a first resistor, the control electrode of the first transistor being connected between this first resistor and this third transistor;
a bridge of resistors connected between the first and second power supply terminals of the sensor, this bridge comprising at least two resistors connected in series and the control electrode of the third transistor being connected between these two resistors of the bridge of resistors.

4. The installation as claimed in claim 2, wherein the monitoring module comprises:
a second branch connected between the first and second power supply terminals of the sensor, this second branch comprising a fourth transistor, the power electrodes of which are connected in series with a second resistor, the control electrode of the second transistor being connected between this second resistor and this fourth transistor;
a bridge of resistors connected between the first and second power supply terminals of the sensor, this bridge comprising at least two resistors connected in series and the control electrode of the fourth transistor being connected between these two resistors of the bridge of resistors.

5. The installation as claimed in claim 3, wherein the control electrode of the first transistor is connected between the first resistor and the third transistor by means of an inverter stage, this inverter stage comprising a fifth transistor and a resistor, this fifth transistor comprising:
a power electrode connected to the measurement cable by means of the resistor of the inverter stage;
another power electrode connected to the second power supply cable; and
a control electrode connected between the first resistor and the third transistor;
the control electrode of the first transistor being connected between the fifth transistor and the resistor of the inverter stage.

6. The installation as claimed in claim 1, wherein:
the electronic computer comprises:
a third resistor connected between the first power supply terminal and the input terminal thereof;
a fourth resistor connected between the input terminal and the second power supply terminal thereof;
the monitoring module comprises:
a fifth resistor connected between the first power supply cable and a central point electrically isolated from the measurement cable;
a sixth resistor connected between the central point and the second power supply cable; and
the control electrode of the first transistor and/or of the second transistor is connected to the central point without passing via the fifth and sixth resistors so as to generate a signal which triggers the switching of the first transistor in response to the loss of first potential on the first power supply cable and which triggers the switching of the second transistor in response to the loss of second potential on the second power supply cable.

7. The installation as claimed in claim 1, wherein the power electrodes of the first transistor are connected in series with a first diode that prevents the circulation of a current from the second power supply cable to the measurement cable.

8. The installation as claimed in claim 2, wherein the power electrodes of the second transistor are connected in series with a second diode that prevents the circulation of a current from the measurement cable to the first power supply cable.

9. The installation as claimed in claim 1, wherein:
the electronic computer comprises:
a third resistor connected between the first power supply terminal and the input terminal thereof;
a fourth resistor connected between the input terminal and the second power supply terminal thereof;
the values of the third and fourth resistors are such that, when the measurement cable is interrupted, the analog electric signal at the input terminal of the electronic computer assumes a third predetermined fault value, this third fault value being different from the first and second fault values and being outside any predetermined measurement range; and
the microprocessor is also programmed to indicate the interrupted state of the measurement cable if the value of the digital signal corresponds to the third fault value.

10. The installation as claimed in claim 1, wherein the transistor(s) of the monitoring module are bipolar transistors.

11. The installation as claimed in claim 1, wherein, when the first potential is greater than the second potential, the first transistor is a PNP transistor and, when the first potential is less than the second potential, the first transistor is an NPN transistor.

12. An aircraft comprising an electrical installation, wherein the electrical installation is an electrical installation as claimed in claim 1.

13. A monitoring module for completing an electrical installation as claimed in claim 1, this monitoring module being capable of being positioned between the power supply terminals of the sensor and the first and second power supply cables, this monitoring module being capable of generating, on the measurement cable, the first fault value in response to the interruption of the first power supply cable, wherein
the monitoring module comprises a first transistor comprising a first and a second power electrode and a control electrode, this first transistor being capable of switching, as a function of the control signal received on the control electrode thereof, between:
an open state, in which the power electrodes thereof are electrically isolated from each other; and
a closed state, in which the power electrodes thereof are electrically connected to each other;
the first and the second power electrodes of the first transistor being electrically connected to the second power supply cable and to the measurement cable, respectively, so that, when the first transistor is in the closed state thereof, the first fault value is generated on the measurement cable, and
the control electrode of the first transistor being connected to the first power supply cable, so that the loss of first potential on the first power supply cable, caused by the interruption thereof, automatically triggers the switching of the first transistor to the closed state thereof and so that, alternatively, the absence of interruption of the first power supply cable keeps the first transistor in the open state thereof.

* * * * *

UNITED STATES PATENT AND TRADEMARK OFFICE
CERTIFICATE OF CORRECTION

| | | |
|---|---|---|
| PATENT NO. | : 11,762,039 B2 | |
| APPLICATION NO. | : 17/438089 | |
| DATED | : September 19, 2023 | |
| INVENTOR(S) | : Hervé Carton, Thomas Stemmelen and Loic Clémenson | |

Page 1 of 1

It is certified that error appears in the above-identified patent and that said Letters Patent is hereby corrected as shown below:

In the Specification

| | | |
|---|---|---|
| Column 4, | Line 20, | change "be Observed during" to --be observed during-- |
| Column 4, | Line 22, | change "than 0.01 (VH-VL)" to --than 0.01(VH-VL)-- |
| Column 5, | Line 44, | change "[VON-ε, VON+ε]" to --[VON-ε; VON+ε]-- |
| Column 10, | Line 14, | change "R11 and 113 are" to --R11 and R13 are-- |
| Column 14, | Line 24, | change "than Transit diodes." to --than Transil diodes.-- |

Signed and Sealed this
Second Day of January, 2024

Katherine Kelly Vidal
*Director of the United States Patent and Trademark Office*